(12) United States Patent
Lin et al.

(10) Patent No.: US 8,363,431 B2
(45) Date of Patent: Jan. 29, 2013

(54) OSCILLATOR HAVING TIME-VARIANT FREQUENCY DEVIATION AND RELATED POWER SUPPLY

(75) Inventors: Chin-Yen Lin, Hsinchu County (TW); Min-Chu Chien, Hsinchu County (TW)

(73) Assignee: Noveltek Semiconductor Corp., Zhubei, Hsinchu County (TW)

( * ) Notice: Subject to any disclaimer, the term of this patent is extended or adjusted under 35 U.S.C. 154(b) by 177 days.

(21) Appl. No.: 12/883,187

(22) Filed: Sep. 16, 2010

(65) Prior Publication Data

US 2011/0228572 A1    Sep. 22, 2011

Related U.S. Application Data

(60) Provisional application No. 61/314,179, filed on Mar. 16, 2010.

(51) Int. Cl.
*H02M 3/335* (2006.01)
(52) U.S. Cl. .................................................... 363/21.18
(58) Field of Classification Search .... 363/21.12–21.18, 363/21.04–21.1
See application file for complete search history.

(56) References Cited

U.S. PATENT DOCUMENTS

| | | | |
|---|---|---|---|
| 6,107,851 A | 8/2000 | Balakirshnan et al. | |
| 6,229,366 B1 | 5/2001 | Balakirshnan et al. | |
| 6,249,876 B1 | 6/2001 | Balakrishnan et al. | |
| 6,671,143 B2* | 12/2003 | Hwang | 361/18 |
| 7,106,040 B1* | 9/2006 | Maksimovic et al. | 323/314 |
| 7,208,995 B2* | 4/2007 | Hashimoto | 327/536 |
| 8,054,655 B2* | 11/2011 | Moyer et al. | 363/21.13 |
| 2005/0253636 A1 | 11/2005 | Yang et al. | |
| 2006/0017426 A1 | 1/2006 | Yang et al. | |
| 2006/0043946 A1* | 3/2006 | Rose | 323/280 |
| 2006/0050539 A1 | 3/2006 | Yang et al. | |
| 2007/0176588 A1* | 8/2007 | Nishida | 323/284 |
| 2008/0310194 A1* | 12/2008 | Huang et al. | 363/21.18 |
| 2009/0196072 A1* | 8/2009 | Ye | 363/17 |
| 2010/0117735 A1* | 5/2010 | Oelmaier | 330/253 |
| 2010/0320992 A1* | 12/2010 | Dearn | 323/311 |

* cited by examiner

*Primary Examiner* — Adolf Berhane
*Assistant Examiner* — Jeffrey Gblende
(74) *Attorney, Agent, or Firm* — Winston Hsu; Scott Margo (57) ABSTRACT

An oscillator with time-variant frequency deviation for a power supply includes a signal generator for generating a first signal according to a clock signal and a comparing unit for adding an offset to at least one of the first signal and a threshold voltage corresponding to the first signal and for comparing the first signal and the threshold voltage after completion of the offset adding, to generate the clock signal whose frequency deviates with variation of the added offset.

18 Claims, 12 Drawing Sheets

OSCILLATOR HAVING TIME-VARIANT FREQUENCY DEVIATION AND RELATED POWER SUPPLY

CROSS REFERENCE TO RELATED APPLICATIONS

This application claims the benefit of U.S. Provisional Application No. 61/314,179, field on Mar. 16, 2010 and entitled "Comparator and Related Oscillator for Frequency Jitter Generation for Power Supply" the contents of which are incorporated herein in their entirety.

BACKGROUND OF THE INVENTION

1. Field of the Invention

The present invention relates to an electronic device, and more particularly to an oscillator having time-variant frequency deviation and related power supply.

2. Description of the Prior Art

A power supply that converts an alternating current (AC) mains voltage to a direct current (DC) voltage can maintain an output voltage, current or power within a regulated range for efficient and safe operation of an electronic device. Compared with a traditional linear power supply, a switching power supply utilizing a pulse width modulation (PWM) controller has been used widely due to the high efficiency and generally includes an input stage, a power factor correction (PFC) stage, a power stage and a feedback stage. The input stage can convert an AC mains voltage to a DC voltage; the power factor correction stage can adjust a power factor of the power supply to conform to various product specifications; the power stage includes the driving components and circuits such as a power switch and the pulse width modulation device, etc. The PWM controller cooperating with the oscillator controls a switching frequency of the power switch according to the load condition outputted from feedback stage to achieve stable voltage or stable current. However, in order to achieve the goal, the switching frequency of the power switch is usually higher than the frequency of the AC mains voltage, thereby causing partial high frequency signals to be injected back into the AC mains input and become part of the AC mains signal. In addition, such high frequency signal operation radiates the electromagnetic wave that causes electromagnetic interference (EMI) and affects the inner and outer electronic components of the power supply.

In order to solve the abovementioned electromagnetic interference problem, some documents as below discloses ways for producing the time-variant frequency deviation during the pulse width modulation.

U.S. Pat. No. 6,107,851 discloses an oscillator with pulse width modulation for producing frequency jitter by means of the variable current generated by the outer transistor (such as the transistor 500 shown in FIG. 3 of U.S. Pat. No. 6,107,851) of the oscillator. And U.S. Pat. No. 6,229,366 also discloses the similar method to generate frequency jitter.

U.S. Pat. No. 6,249,876 discloses a primary oscillator, a counter and a current source set for producing frequency jitter, as shown in FIG. 1 of U.S. Pat. No. 6,249,876. When the counter is controlled by the oscillator, each output can represent a specific time interval, and the current source set controls the primary oscillator to change the oscillatory frequency according to the specific time interval to generate frequency jitter.

U.S. Pat. No. 7,026,851 discloses a pulse width modulation controller with frequency jitter. In the pulse width modulation controller 2 of FIG. 2 of U.S. Pat. No. 7,026,851, the modulator 300 generates the jitter current $I_{scan}$ and $I_{adj}$ according to the pulse signal PLS and the reference current $I_{REF}$. The reference current $I_{REF}$ generated by the oscillator 200 is used for determining a switching frequency affected by the modulation of the jitter current $I_{SCAN}$.

The abovementioned 4 US patents all use the method of inputting an outer variable current into the oscillator to generate frequency jitter.

In addition, U.S. Pat. No. 7,203,079 discloses a switching controller having frequency hopping for reducing the EMI of a power supply. The power supply of this patent includes a pattern generator, an oscillator, and a programmable capacitor (e.g. the programmable capacitor 290 of U.S. Pat. No. 7,203,079). The pattern generator generates a digital pattern code in response to a clock signal. The oscillator generates an oscillation signal for determining a switching frequency of a switching signal. The programmable capacitor coupled to the oscillator modulates the switching frequency in response to the variation of the digital pattern code.

U.S. Pat. No. 7,061,780 discloses a controller which includes a pattern generator for generating a digital pattern code to control a programmable capacitor that is connected to an oscillator (as the programmable capacitor 910 shown on FIG. 3 in U.S. Pat. No. 7,061,780). In this way, frequency hopping can be achieved to reduce the EMI effect.

The abovementioned 2 US patents both utilize the variable capacitor outside the oscillator to input a variable voltage into the oscillator to generate frequency jitter.

SUMMARY OF THE INVENTION

It is thereof an objective of the present invention to provide an oscillator having time-variant frequency deviation and related power supply to reduce the electromagnetic interference produced by the power supply.

The present invention discloses an oscillator with time-variant frequency deviation for a power supply. The oscillator comprises a signal generator for generating a first signal according to a clock signal; and a comparing unit for adding an offset to at least one of the first signal and a threshold voltage corresponding to the first signal and for comparing the first signal and the threshold voltage after completion of the offset adding, to generate the clock signal whose frequency deviates with variation of the added offset.

The present invention discloses a power supply with time-variant frequency deviation. The power supply comprises a pulse width modulation (PWM) controller for generating a switch signal for adjusting a load current of the power supply according to a clock signal and a feedback signal, wherein the feedback signal includes the variation information of the load current; and a oscillator for adding an offset to at least one of the first signal and a threshold voltage corresponding to the first signal and for comparing the first signal and the threshold voltage after completion of the offset adding, to generate the clock signal whose frequency deviates with variation of the offset.

These and other objectives of the present invention will no doubt become obvious to those of ordinary skill in the art after reading the following detailed description of the preferred embodiment that is illustrated in the various figures and drawings.

DETAILED DESCRIPTION

The present invention mainly discloses a comparing unit of an oscillator in the power supply and the comparing unit adjusts amplitude(s) of the input signal(s) to generate a clock signal whose frequencies and duty cycles changes with the variation of the amplitude adjustment. The frequency/duty cycle of the clock signal varying with time is so called frequency jitter.

Figure 1:
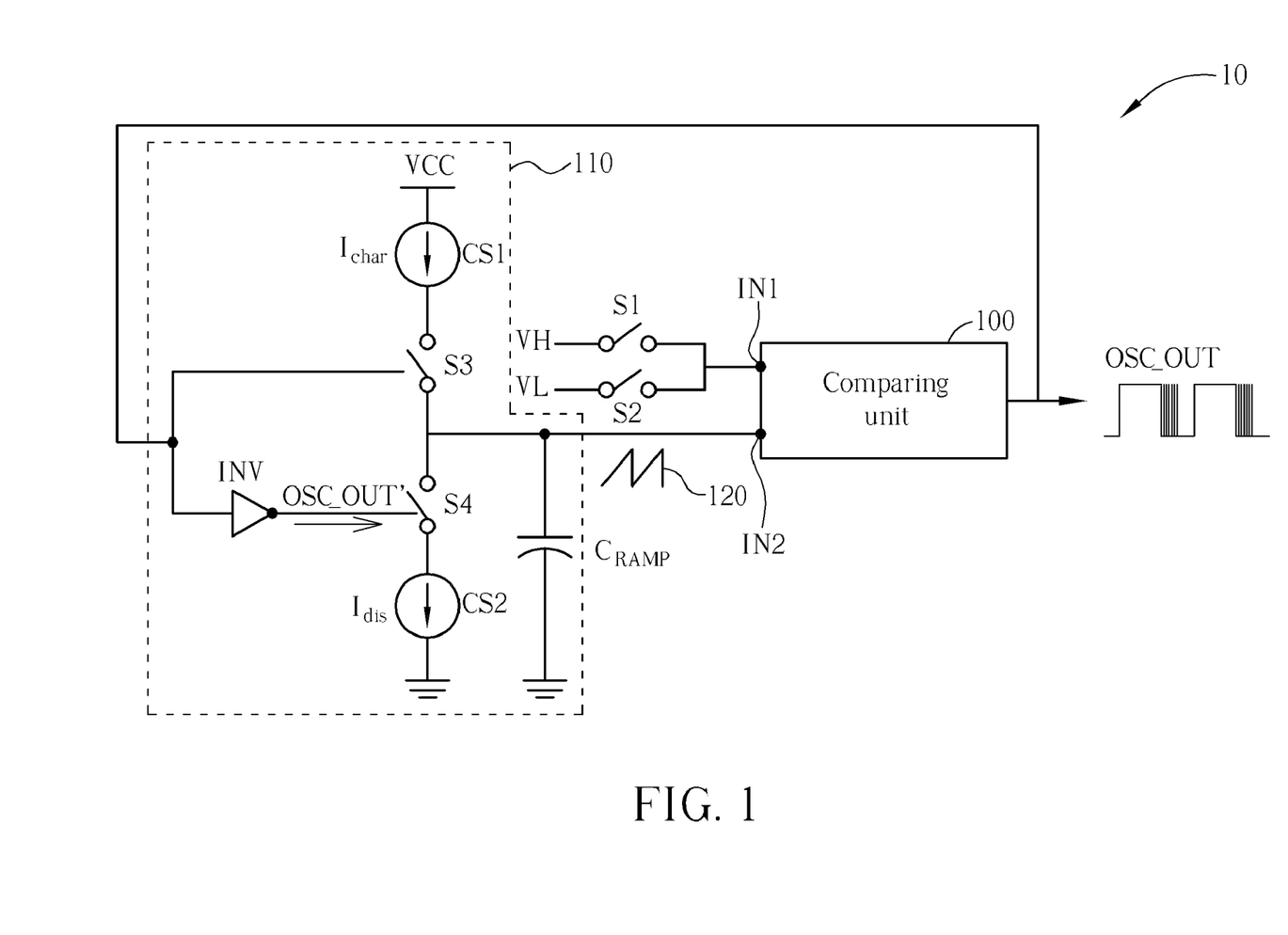
FIG. 1 is a diagram of an oscillator according to an embodiment of the present invention.

Please refer to FIG. 1, which illustrates a schematic diagram of an oscillator 10 according to an embodiment of the present invention. The oscillator 10 includes a comparing unit 100, a signal generator 110, switches S1 and S2. The comparing unit 100 with input ends IN1 and IN2. The input end IN1 receives an upper threshold voltage VH or a lower threshold voltage VL via the switching of the switches S1 and S2. The input end IN2 receives a ramp signal 120 generated by the signal generator 110. Please note that the input signal of the input end IN2 is not be limited to the ramp signal and can be a saw-tooth wave signal etc. The comparing unit 100 adjusts one of the received upper threshold voltage VH, lower threshold voltage VL and ramp signal 120 by inserting the amplitude offset, where the inserting method is described below in details. After the comparing unit 100 finishes inserting the amplitude offset, the ramp signal 120 compares with the upper threshold voltage VH or the lower threshold voltage VL to generate a clock signal OSC_OUT. In addition, the clock signal OSC_OUT is fed back to the signal generator 110 to generate and control the ramp signal 120, for example changing the ramp rate of the ramp signal 120. The signal generator 110 includes current sources CS1, CS2, a charge switch S3, an inverter INV, a discharge switch S4 and a capacitor $C_{RAMP}$. The current sources CS1 and CS2 provide the capacitor $C_{RAMP}$ with a charge current $I_{char}$ and a discharge current $I_{dis}$ respectively. The charge switch S3 is controlled by the clock signal OSC_OUT, and the discharge switch S4 is controlled by the inverse clock signal OSC_OUT' which is the inverse signal of the clock signal OSC_OUT outputted by the inverter INV. The capacitor $C_{RAMP}$ generates the ramp signal 120 by being charged via the charge current $I_{char}$ in the control of the charge switch S3 and being discharged via the discharge current $I_{dis}$ in the control of the discharge switch S4. In the oscillator 10, the clock frequency and duty cycle of the clock signal OSC_OUT varies with variation of amplitude offsets.

In other words, the clock signal OSC_OUT inputted by the oscillator 10 has time-variant frequency deviation by the amplitude offset inserting of the comparing unit 100.

Figure 2:
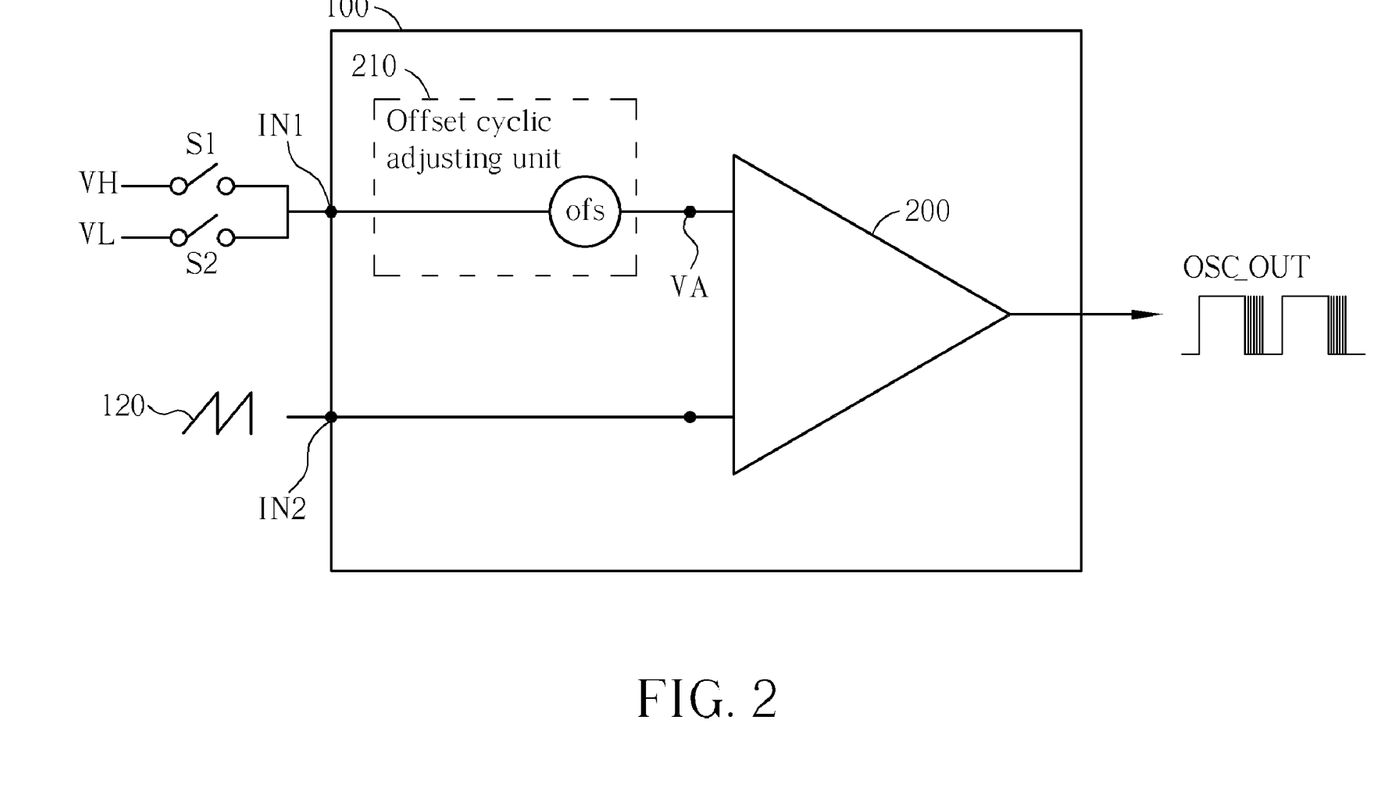
FIG. 2 is a diagram of a comparing unit of the oscillator according to an embodiment of the present invention.
Figure 3:
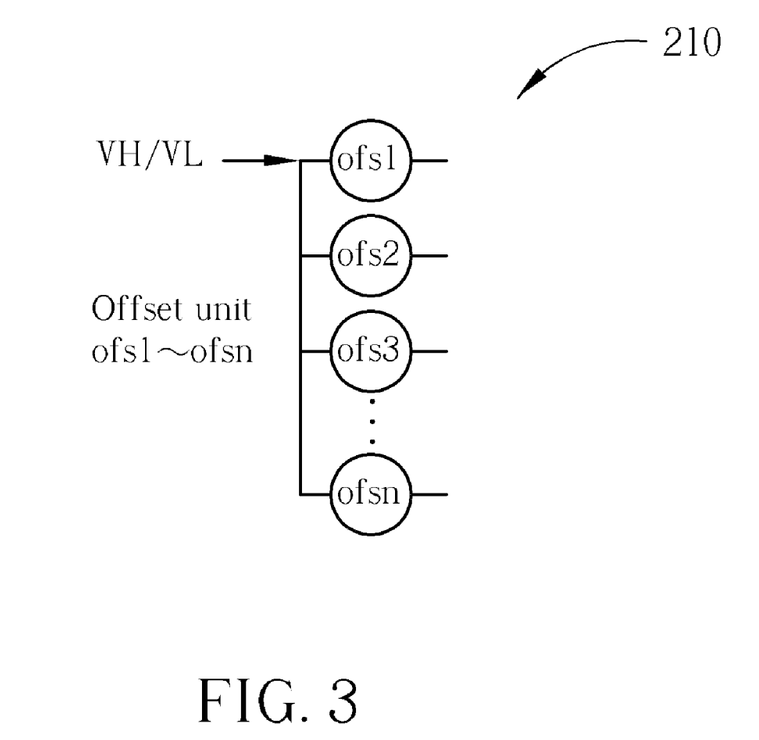
FIG. 3 is a diagram of an offset loop adjusting unit of the oscillator according to an embodiment of the present invention.

Please refer to FIG. 2, which illustrates a schematic diagram of a comparing unit 100 shown on FIG. 2 according to an embodiment of the present invention. The comparing unit 100 includes a comparator 200 and an offset cyclic adjusting unit 210. The offset cyclic adjusting unit 210 is used for inserting the offset into the signal amplitude on the input end IN1 (e.g. the upper threshold voltage VH and/or the low threshold voltage) to generate an offset threshold voltage VA. The comparator 200 is used for comparing the ramp signal 120 with the offset threshold voltage VA to generate the clock signal OSC_OUT. The comparator 200 may be a typical comparator; therefore, the detail operation principle is a well-known in the art, so the detailed description is omitted herein. In addition, the offset cyclic adjusting unit 210 may include parallel offset units ofs1-ofsn shown in FIG. 3 to insert the offset into the upper threshold voltage VH or the lower threshold voltage VL in an aggregately increasing/decreasing, cyclic method. For example, the offset value can be variable with time as below: 0 mV (microvolt)→8 mV→16 mV→32 mV→64 mV→128 mV→64 mV→32 mV→16 mV→8 mV→0 mV. Under this offset varying method, if the clock signal OSC_OUT is 40 kHz, the clock signal OSC_OUT has time-variant frequency deviation with about 5%. Please note that the example of the present invention also can place the offset cyclic adjusting unit 210 on the signal branch of the input end IN2 to insert the offset into the amplitude of the ramp signal 120 by the abovementioned method.

According to the comparing result variation of the comparator 200, the offset threshold voltage VA is generated according to the upper threshold voltage VH or the lower threshold voltage VL. For example, during the rising period of the ramp signal 120, the output of the clock signal OSC_OUT is at a high voltage level, the switch S1 is conducted, and the switch S2 is cut off. In this situation, the voltage for producing the offset threshold voltage VA is the upper threshold voltage VH. When the ramp signal 120 rises up to the upper threshold voltage VH, the ramp signal 120 starts to fall down, and at this moment, the switch S1 becomes cut-off and the switch S2 becomes conducted. In this situation, the voltage for producing the offset threshold voltage VA is the lower threshold voltage VL. During the falling period of the ramp signal 120, the output of the clock signal OSC_OUT is at a low voltage level. When the ramp signal 120 falls down to the lower threshold voltage VL, the ramp signal 120 starts to rise again, and at this moment, the switch S1 again becomes conducted and the switch S2 becomes cut-off. In this situation, the voltage for producing the offset threshold voltage VA changes back to the upper threshold voltage VH.

Figure 4:
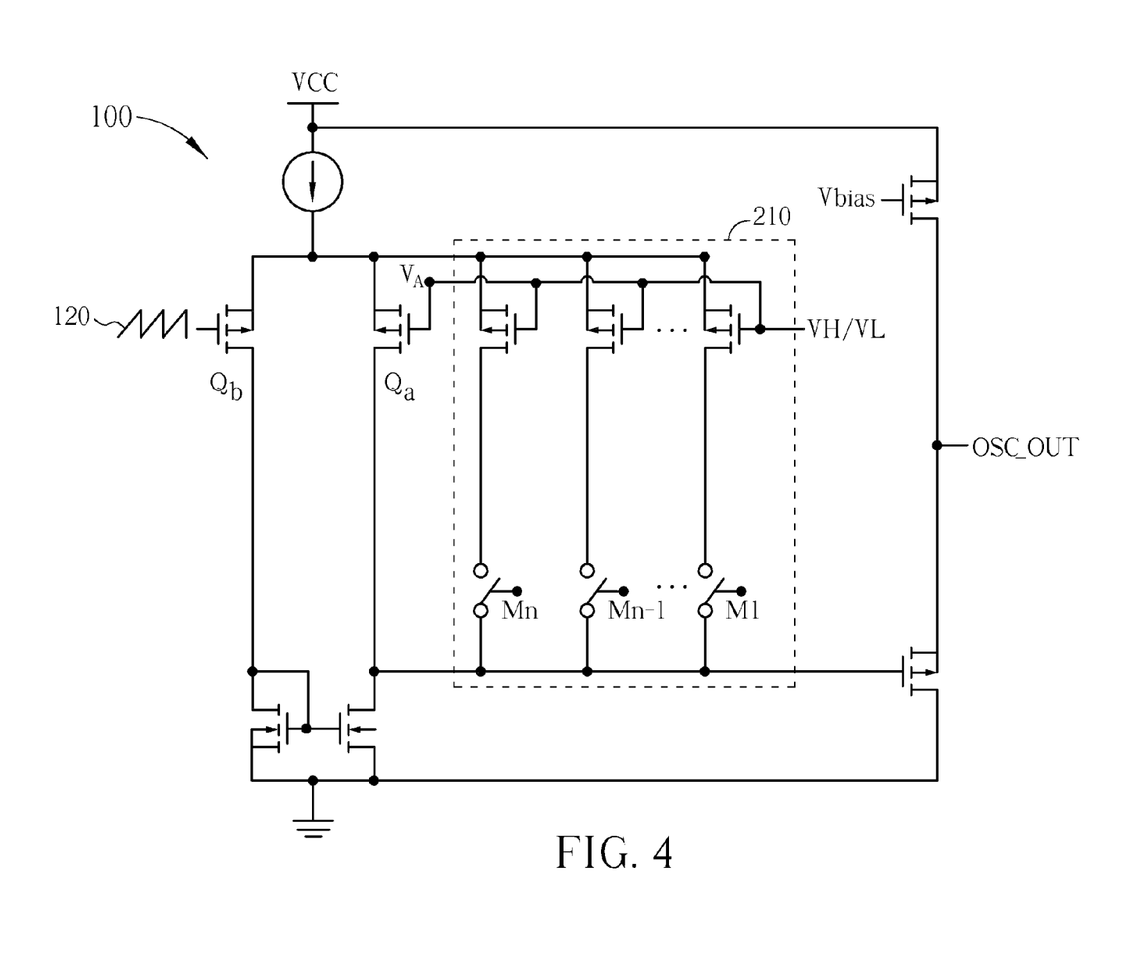
FIG. 4 is a circuit of a comparing unit of the oscillator according to an embodiment of the present invention.

Please refer to FIG. 4, which illustrates a circuit of a comparing unit 100 of FIG. 2 according to an embodiment of the present invention. A comparator 200 of the comparing unit 100 includes components except the offset cyclic adjusting unit 210 and generates the clock signal OSC_OUT by comparing the offset threshold voltage VA with the ramp signal 120, where the offset threshold voltage VA and the ramp signal 120 are inputted into the transistor Qa and Qb respectively. The architecture and principle of the comparator 200 is a well-known in the art, so the detailed description is omitted herein. The offset cyclic adjusting unit 210 includes n branches and each branch is combined with a transistor and a switch. Each branch conducted by corresponding switch can add an offset portion to the upper threshold voltage VH and/or the lower threshold voltage VL. In other words, the switches M1-Mn provide different offset values by conducting or cutting off corresponding branches. For example, when all the switches M1-Mn control corresponding branches to be conducted, the offset cyclic adjusting unit 210 adds the maximum offset as the abovementioned 128 mV; when all the switches M1-Mn cut off corresponding branches, the offset cyclic adjusting unit 210 does not provide any offset, and at this moment the offset threshold voltage VA equals to the upper threshold voltage VH or the lower threshold voltage VL. Therefore, when the offset cyclic adjusting unit 210 turns on the switches M1-Mn in turn and then turns off the switches M1-Mn in turn, the offset threshold voltage VA can form a saw-tooth wave which undergoes the offset adding on the basis of the upper threshold voltage VH or the lower threshold voltage VL. With the time-variant input (i.e. the offset threshold voltage VA) of the comparator 200, the frequency and the duty cycle of the clock signal OSC_OUT also increase or decrease gradually with time, namely generates the time-variant frequency deviation.

Figure 5:
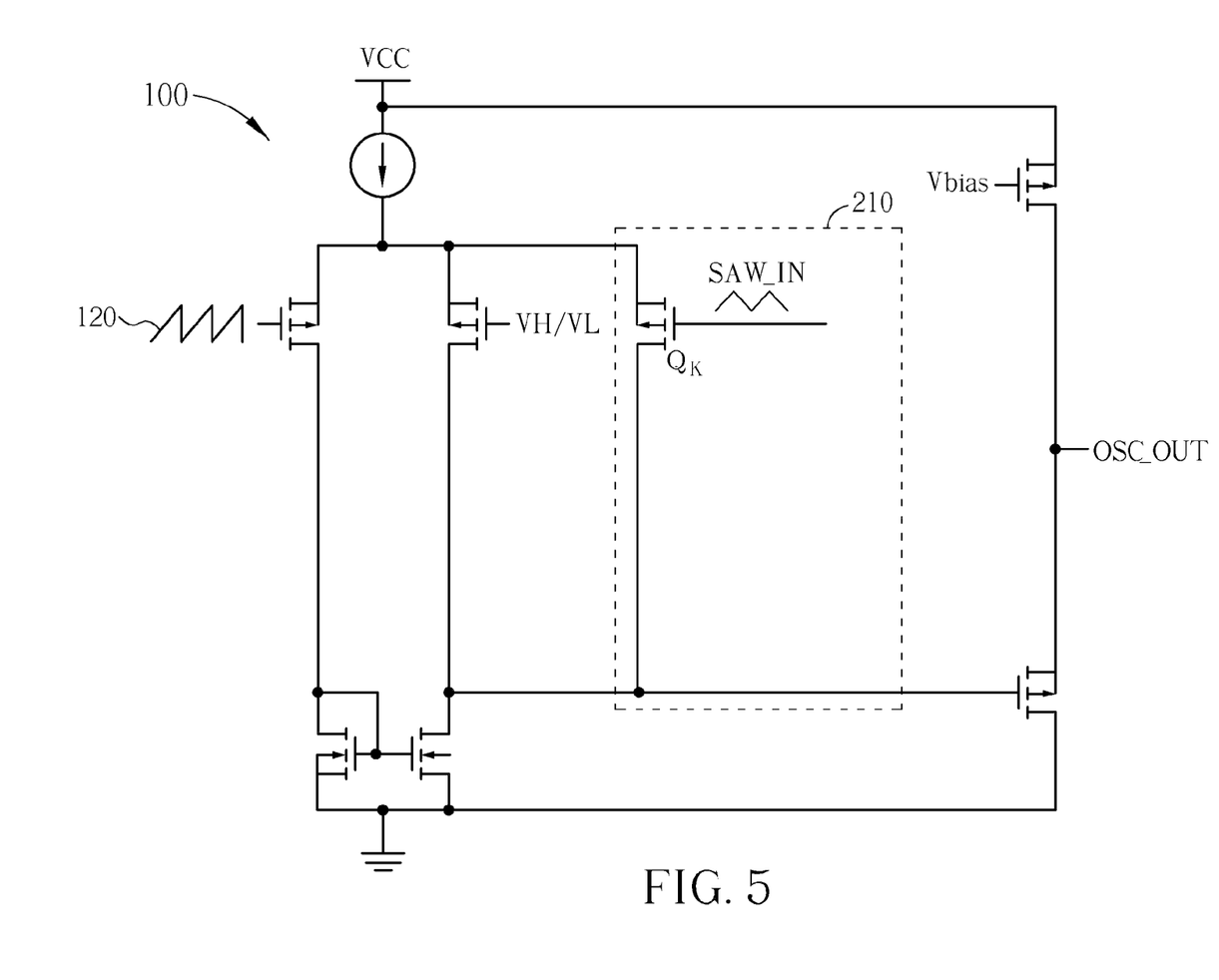
FIG. 5 is a circuit of another comparing unit according to an embodiment of the present invention.

Please refer to FIG. 5, which illustrates a schematic diagram of the comparing unit 100 shown on FIG. 1 according to another embodiment of the present invention. The comparator 200 of the comparing unit 100 shown in FIG. 5 has the same structure as the comparator 200 of FIG. 4 does. The offset cyclic adjusting unit 210 of FIG. 5 mainly includes a transistor Qk for receiving a saw-tooth wave SAW_IN used as the offset for the upper threshold voltage VH or the low threshold voltage LV of the comparator 200. When the saw-tooth wave falls down to the lowest voltage level 0 mV, the comparator 200 compares the ramp signal 120 with the upper threshold voltage VH or the lower threshold voltage VL. When the saw-tooth wave signal rises up to the highest voltage level, the comparator 200 compares the ramp signal 120 with the upper threshold voltage VH or the lower threshold voltage VL, which has been added the maximum offset. The comparing unit 100 can generate the clock signal OSC_OUT with time-variant frequency deviation via the periodical variation of the saw-tooth wave signal.

Figure 6A:
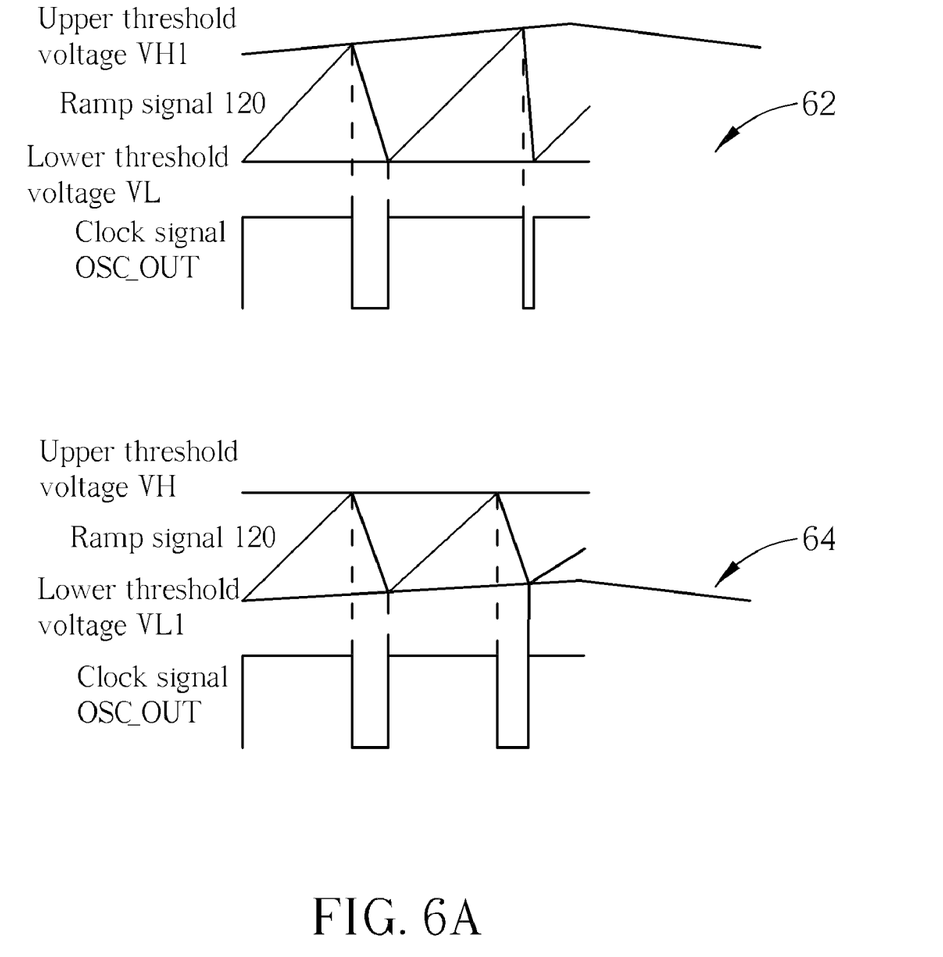
FIG. 6A and FIG. 6B are diagrams of related signal waveform according to an embodiment of the present invention.
Figure 6B:
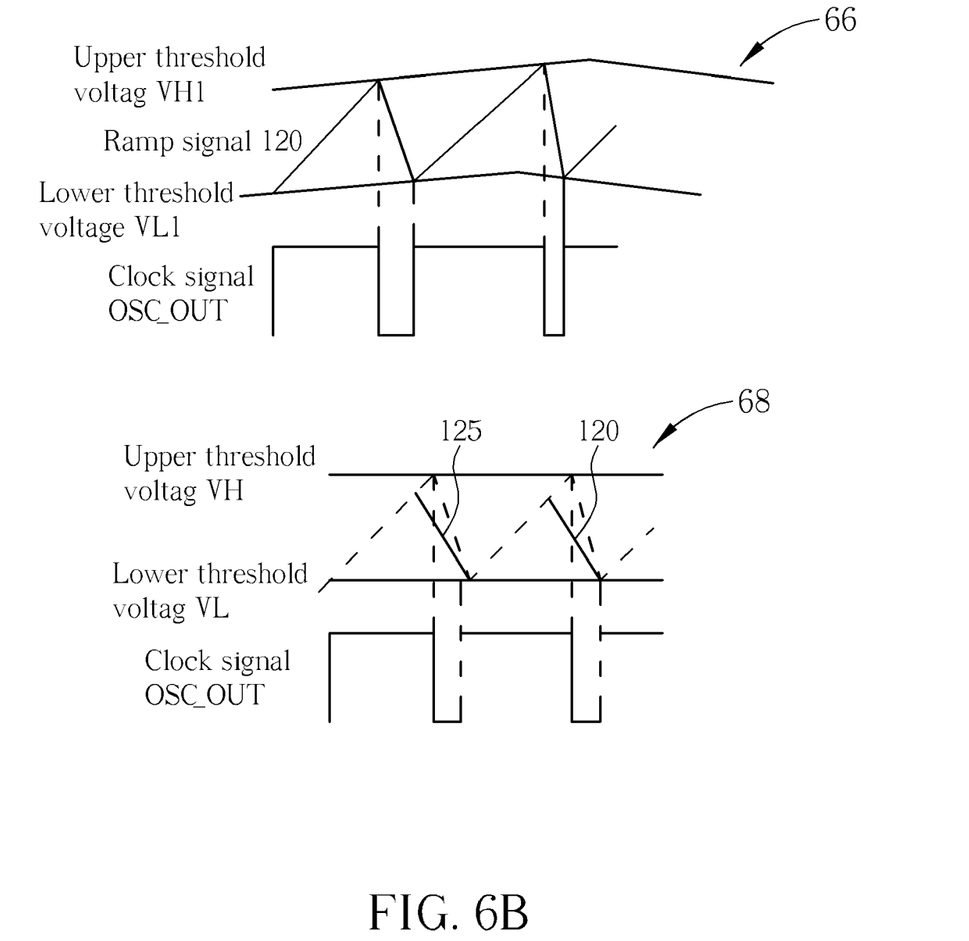

Please refer to FIGS. 6A and 6B, which illustrate the waveforms of the signals shown in FIG. 1 according to an embodiment of the present invention. In the signal waveform 62, the upper threshold voltage VH adds the offset of the saw-tooth waveform to become a new offset upper threshold voltage VH1. When the offset upper threshold voltage VH1 rises gradually, because of the fixed lower threshold voltage VL, it causes the ramp signal 120 to rise to the offset upper threshold voltage VH1 with more time. In other words, the time of the clock signal OSC_OUT for outputting the high voltage level becomes longer. On the contrary, when the offset upper threshold voltage VH1 falls down gradually, the ramp signal 120 needs less time to rise to the upper threshold voltage VH1 and shortens the time of the clock signal OSC_OUT for outputting the high voltage level. From above, the duty cycle of the clock signal OSC_OUT changes with the variation of the offset upper threshold voltage VH1 to achieve the effect of time-variant frequency deviation.

In the signal waveform 64, the lower threshold voltage VL is added the offset of the saw-tooth waveform to become a new offset lower threshold voltage VL1. When the offset lower threshold voltage VL1 rises gradually, because of the fixed upper threshold voltage VH, the ramp signal 120 can fall down to the offset lower threshold voltage VL1 by less time. In other words, the time of outputting the clock signal OSC_OUT at the low voltage level becomes shorter. On the contrary, when the offset lower threshold voltage VL1 falls down gradually, the ramp signal 120 needs longer time to fall down to the offset lower threshold voltage VL1 and enlarges the time of outputting the clock signal OSC_OUT at the low voltage level. From the above, the duty cycle of the clock signal OSC_OUT changes with the variation of the offset lower threshold voltage VL1 to achieve the time-variant frequency deviation.

In the signal waveform 66, the upper threshold voltage VH and the lower threshold voltage VL are added the offset formed in the saw-tooth waveform to become the offset upper threshold voltage VH1 and the offset lower threshold voltage VL1, respectively. Please note that the two offsets should have different rising/falling rates to produce different rising and falling periods on the ramp signal 120, so as to generate the time-variant frequency deviation in the clock signal OSC_OUT. The principle for generating the time-variant frequency deviation of the clock signal OSC_OUT can refer the signal waveforms 62 and 64.

In the signal waveform 68, neither the upper threshold voltage VH nor the lower threshold voltage VL is added any offset, whereas the ramp signal 120 is added the offset to adjust the rising/falling rate, namely an offset ramp signal 125. In other words, the offset can cause a change of the rising and falling rate of the ramp signal 120 and thereby the time of outputting the clock signal OSC_OUT at the high voltage level or the low voltage level is changed to achieve the time-variant frequency deviation. To achieve this, the offset cyclic adjusting unit 210 shown in FIGS. 2-5 can be changed to settle on the branch of the ramp signal 120 to add the offset to the ramp signal 120.

Figure 7:
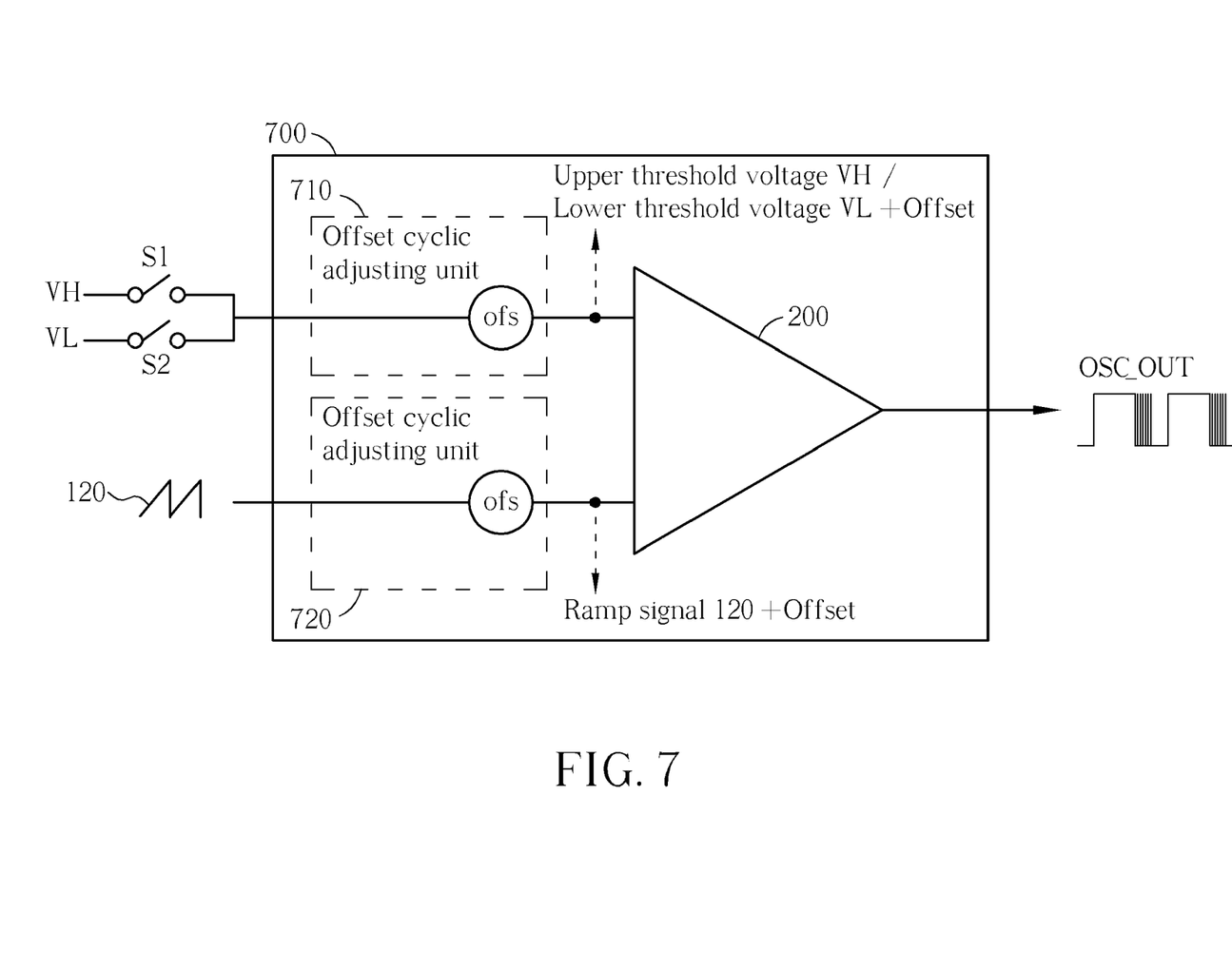
FIG. 7 is a diagram of a comparing unit of the oscillator according to an embodiment of the present invention.

Please refer to FIG. 7, which illustrates a schematic diagram of a comparing unit 700 according to an embodiment of the present invention. The comparing unit 700 can be the comparing unit 100 shown in the FIG. 1 and includes the comparator 200 shown in FIG. 2 and the offset cyclic adjusting units 710, 720, which add the offset to the upper threshold voltage VH/the lower threshold voltage VL and the ramp signal 120, respectively. The working principle of each component of the comparing unit 700 can refer to the abovementioned description, so the detailed description is omitted herein. Please note that the methods for adding the offset used by the offset cyclic adjusting units 710 and 720 should be discordant to generate the time-variant frequency deviation of the clock signal OSC_OUT. For example, if the offsets generated by the offset cyclic adjusting units 710 and 720 both are of the saw-tooth waveforms, the offsets should be generated with different slope rates. In other words, the saw-tooth wave signals should be different in at least one of the rising and falling rates.

Figure 8:
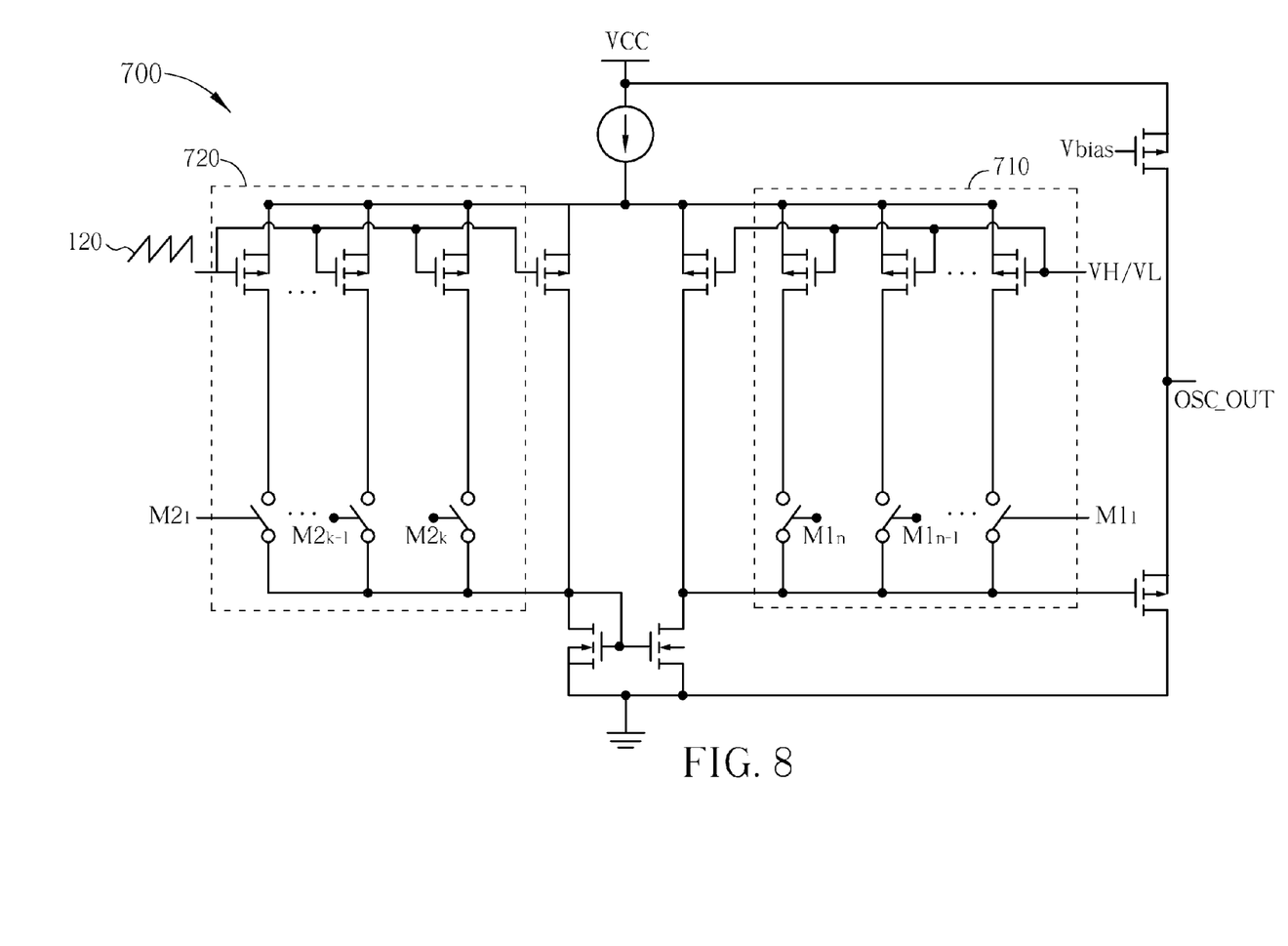
FIG. 8 is a circuit of a comparing unit according to an embodiment of the present invention.

Please refer to FIG. 8, which illustrates a circuit of a comparing unit 700 according to an embodiment of the present invention. The working principle of the comparing unit 700 shown in FIG. 8 is similar with the comparing unit 700 shown in FIG. 4. The difference is that the comparing unit 700 in FIG. 8 includes an offset cyclic adjusting unit 720 installed on the side of the ramp signal end 120 for the offset adding. Therefore, please refer to the above-mentioned description for the detail operation principle. In order to make two offsets with different slope rates, the switches M21-M2K of the offset cyclic adjusting unit 720 and the switches M11-M1n of the offset cyclic adjusting unit 710 should be arranged by different switching frequencies and/or different switching initial times. Therefore, the offset characteristics of the upper threshold voltage VH/the low threshold voltage LV end and the ramp signal 120 end can be different to achieve the time-variant frequency deviation of the clock signal OSC_OUT. Note that those skilled in the art can adjust the number of branches, and the switching sequence and frequencies of the switches in the offset cyclic adjusting units 710 and 720.

Figure 9:
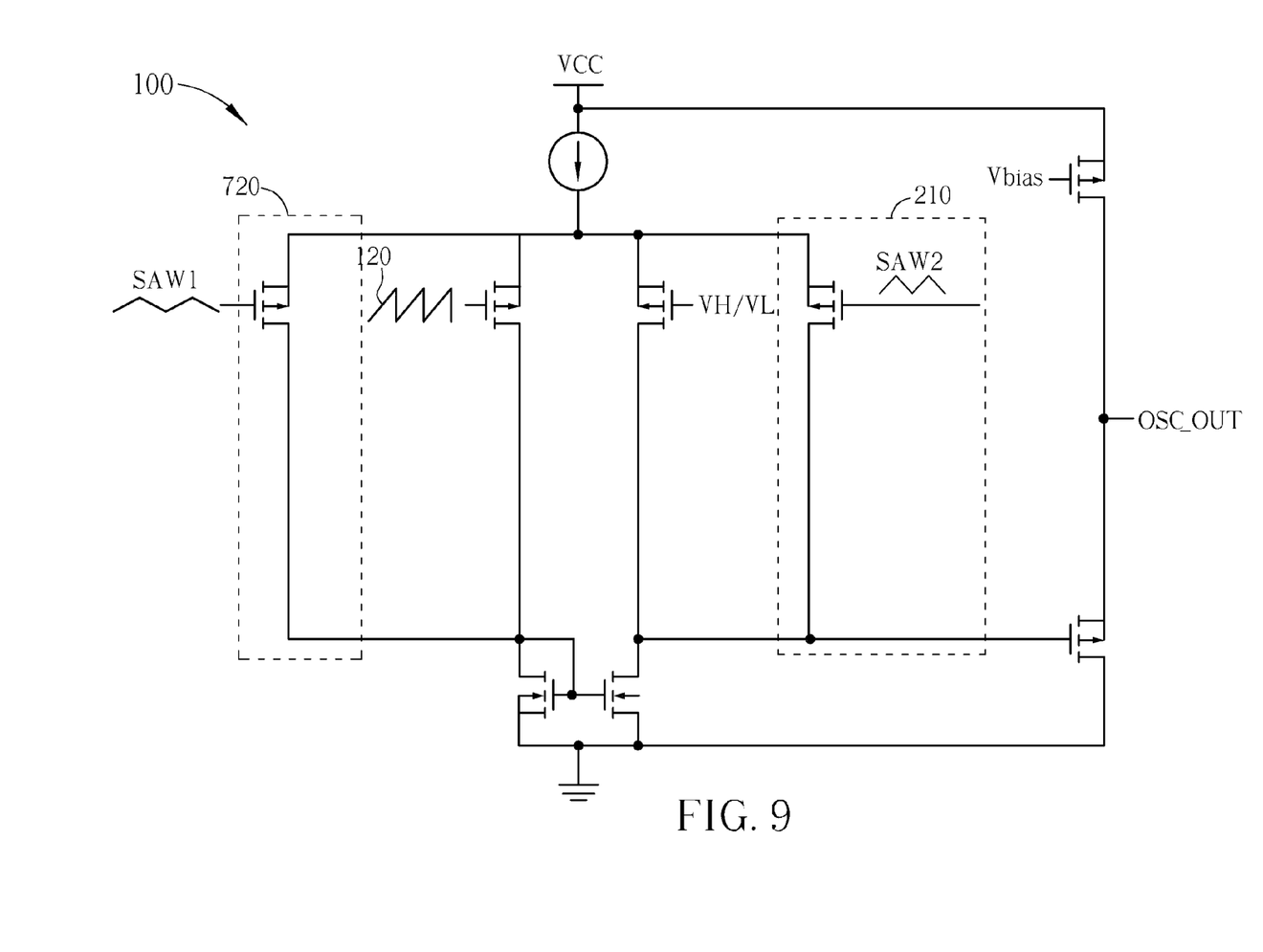
FIG. 9 is a circuit of another comparing unit according to an embodiment of the present invention.

Please refer to FIG. 9, which illustrates a circuit of a comparing unit 700 according to an embodiment of the present invention. The working principle of the comparing unit 700 shown in FIG. 9 is similar to the comparing unit 700 shown in FIG. 5; therefore, please refer to the abovementioned description for the detail operation principle. From FIG. 9, the waveforms of the saw-tooth waves SAW1 and SAW2 used as offsets with different ramps achieve the time-variant frequency deviation of the clock signal OSC_OUT.

Note that the architecture of the offset cyclic adjusting units 710 and 720 shown in FIG. 7 is not limited to have the same type of architecture. For example, when the offset cyclic adjusting unit 710 employs the architecture shown in FIG. 8, the offset cyclic adjusting unit 720 may employ the architecture shown in FIG. 9.

Figure 10:
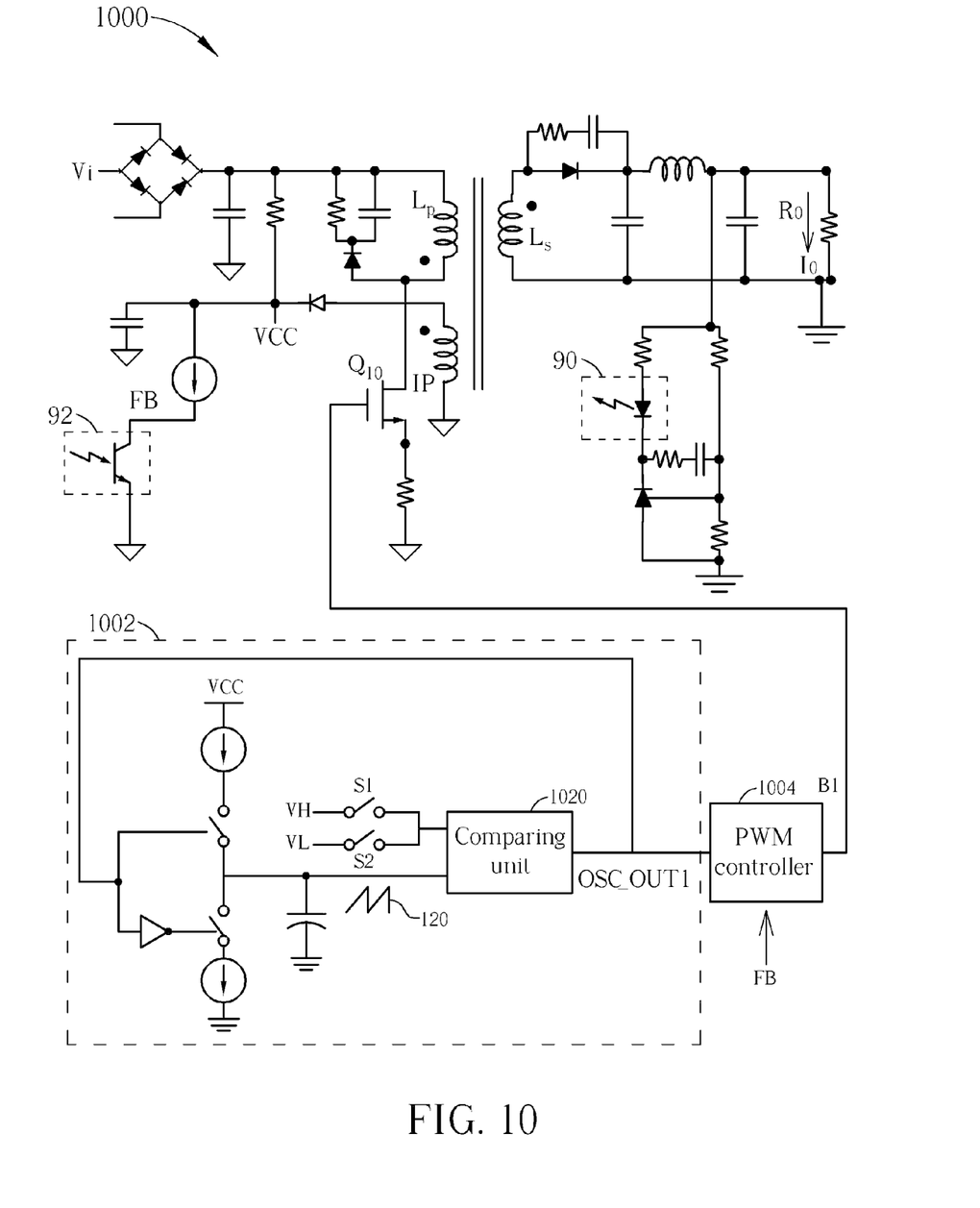
FIG. 10 is a circuit of a power supply with the switching according to an embodiment of the present invention.

Please refer to FIG. 10, which illustrates a circuit of a switching power supply 1000 according to an embodiment of the present invention. In the switching power supply 1000, a comparing unit 1020 of an oscillator 1002 can be any of the abovementioned comparing units for producing the time-variant frequency deviation of a clock signal OSC_OUT. A pulse width modulation controller 1004 generates a switching signal B1 according to a feedback signal FB and the clock signal OSC_OUT1 outputted by the oscillator 1002 to control the switching of a transistor Q10. With controlling the switching of the transistor Q10, the timing of transforming energy from a primary side-winding set Lp to a secondary side-winding set Ls can be controlled appropriately to limit a load current Io within a regulated range, to achieve provision of constant current/voltage. In other words, the switching signal B1 can adjust the current Io. An optical coupling diode 1006 can react to the variation of the load current Io and thereby forward the reaction to the optical coupling diode 1008, so as to generate the feedback signal FB. In other words, the feedback signal FB changes with the variation of the load current Io, thereby reflecting the current state of the load current Io. Therefore, the pulse width modulation controller 1004 can adjust the switching time and frequency of the transistor Q10 appropriately according to the feedback signal FB. The working principle of other components of the power supply 1000 is well-known in the art, so the detailed description is omitted herein. The present invention mainly utilizes the oscillator 1002 to provide the clock signal OSC_OUT1 with time-variant frequency deviation for the pulse width modulation controller 1004, in order to expand the switching frequency to a wider bandwidth. Thus, the high frequency part of the switching frequency does not feed back to the input AC main voltage source Vi to reduce the electromagnetic interference generated by the power supply 1000.

Figure 11:
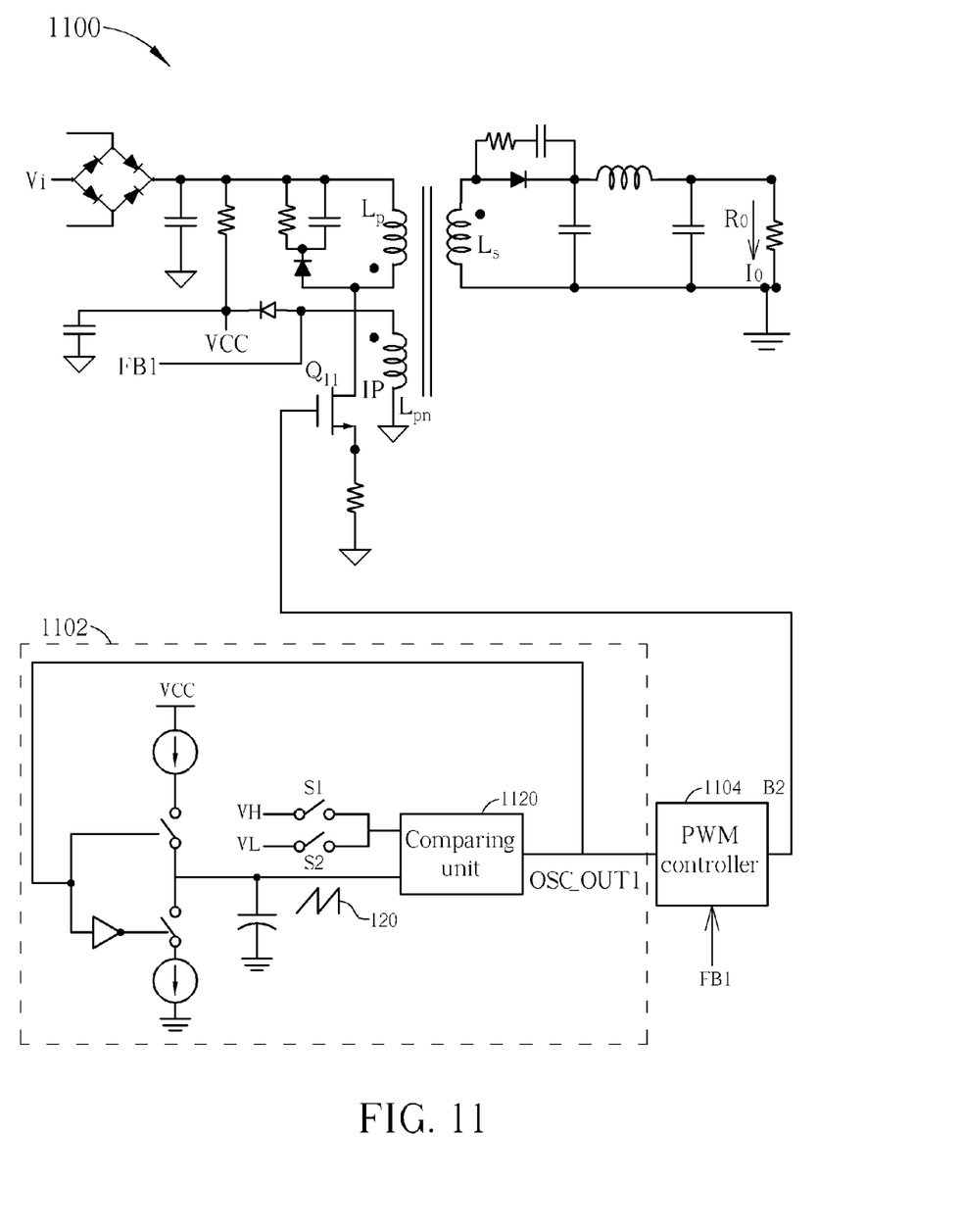
FIG. 11 is a circuit of a power supply with the primary side switching according to an embodiment of the present invention.

Please refer to FIG. 11, which illustrates a circuit of a power supply 1100 with the primary side switching according to an embodiment of the present invention. In the power supply 1100, the comparing unit 1120 of an oscillator 1102 can be any of the above-mentioned comparing units for producing the time-variant frequency deviation of a clock signal OSC_OUT2. The pulse width modulation controller 1104 generates a switching signal B2 according to the clock signal OSC_OUT2 outputted by a feedback signal FB1 and the oscillator 1102 to control the switching of a transistor Q11. By controlling the switching of the transistor Q11, the time of transforming energy from a primary side-winding set Lp to a secondary side-winding set Ls can be controlled appropriately to limit a load current Io to a regulated range, so as to achieve provision of the constant current/voltage. The feedback signal FB1 is generated according to the voltage on a primary side auxiliary winding set Lpn. The voltage on the primary side auxiliary winding set Lpn can react to the variation status of the output voltage from the power supply 1100. The related the primary side switching principle is well-known in the art, so the detailed description is omitted herein. The present invention mainly utilizes the oscillator 1102 to provide the clock signal OSC_OUT2 with time-variant frequency deviation for the pulse width modulation controller 1104, in order to expand the switching frequency to a wider bandwidth and thereby to reduce the electromagnetic interference generated by the power supply 1100. In the abovementioned power supplies 1000 and 1100, the number of the oscillator is not limited to one and multiple oscillators can be employed.

From the above, the present invention provides, in the power supply, an oscillator for adding an offset into at least one of a ramp signal and the high and low threshold voltages corresponding to the ramp signal and after finishing adding the offset, compares the ramp signal with the high/low threshold voltage to generate a clock signal whose frequency has time-variant deviation.

In addition to the abovementioned offset adding methods, the present invention may use the following offset adding methods: {(the high threshold voltage+the offset)+(the ramp signal+the offset)}, {(the low threshold voltage+the offset)+(the ramp signal+the offset)}, {(the high threshold voltage+the offset)+(the low threshold voltage+the offset)+(the ramp signal+the offset)}, etc to generate the clock signal with time-variant frequency deviation.

In conclusion, the present invention adds the offset to at least one input signal of the comparator installed in the oscillator to generate the clock signal with time-variant frequency deviation. And the offset can be adjusted dynamically to control the time-variant frequency deviation. With the oscillator which can generate the frequency jitter, the power supply can reduce the electromagnetic interference.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An oscillator with time-variant frequency deviation for a power supply, the oscillator comprising:
   a signal generator for generating a ramp signal according to a clock signal; and
   a comparing unit coupled to the signal generator, comprising:
      a first input end coupled to a first offset cyclic adjusting unit for receiving one of an upper threshold voltage and a lower threshold voltage to add a plurality of offsets to the upper or lower threshold voltages to generate an offset threshold voltage;
      a second input end coupled to the signal generator for receiving the ramp signal; and
      a comparator coupled to the offset threshold voltage for comparing the ramp signal with the offset threshold voltage, to generate a jitter clock signal whose frequency deviates with variation of the added offset.

2. The oscillator of claim 1, wherein the signal generator comprises:
   a first current source for providing a charge circuit;
   a second current source for providing a discharge circuit;
   a charge switch coupled to the first current source for being controlled by the clock signal;
   a discharge switch coupled to the second current source for being controlled by the inverse signal of the clock signal; and a capacitor for being charged by the charge circuit via the charge switch and for being discharged by the discharge circuit via the discharge switch, to generate the ramp signal.

3. The oscillator of claim 1, wherein the threshold voltage corresponds to an upper threshold voltage or a lower threshold voltage of the ramp signal.

4. The oscillator of claim 1, wherein the comparing unit further comprises:
a second offset cyclic adjusting unit coupled to the second input end and the comparator for providing the offset in a saw-tooth waveform and adding the offset on the ramp signal to generate an offset ramp signal, such that the comparator compares the offset ramp signal with the threshold voltage to generate the jitter clock signal.

5. The oscillator of claim 4, wherein the second offset cyclic adjusting unit comprises:
a plurality of branches, each branch including a switch and a transistor, the gate of each transistor coupled with each other, for receiving the ramp signal, wherein the plurality of switches conducts or cuts off the plurality of branches to generate the offset ramp signal.

6. The oscillator of claim 4, wherein the second offset cyclic adjusting unit is a transistor having a gate for receiving a saw-tooth wave signal used as the offset.

7. The oscillator of claim 1, wherein the first offset cyclic adjusting unit coupled to the first input end and the comparator for providing the offset in a saw-tooth wave form and adding the offset on the threshold voltage to generate an offset threshold voltage such that the comparator compares the ramp signal with the offset threshold voltage to generate the jitter clock signal.

8. The oscillator of claim 7, wherein the first offset cyclic adjusting unit comprises:
a plurality of branches, each branch including a switch and a transistor, the gate of each transistor coupled with each other, for receiving the threshold voltage, wherein the plurality of switches conducts or cuts off the plurality of branches to generate the offset threshold voltage signal.

9. The oscillator of claim 7, wherein the first offset cyclic adjusting unit is a transistor having a gate for receiving a saw-tooth wave signal used as the offset.

10. A power supply with time-variant frequency deviation, the power supply comprising:
a pulse width modulation (PWM) controller for generating a switch signal for adjusting a load current of the power supply according to a clock signal and a feedback signal, wherein the feedback signal includes the variation information of the load current; and
an oscillator coupled to the PWM controller, comprising:
a first input end coupled to a first offset cyclic adjusting unit for receiving one of an upper threshold voltage and a lower threshold voltage to add a plurality of offsets to the upper or lower threshold voltages to generate an offset threshold voltage;
a second input end coupled to the signal generator for receiving the ramp signal; and
a comparator coupled to the offset threshold voltage for comparing the ramp signal with the offset threshold voltage to generate a jitter clock signal whose frequency deviates with variation of the offset.

11. The power supply of claim 10, wherein the signal generator comprises:
a first current source for providing a charge circuit;
a second current source for providing a discharge circuit;
a charge switch coupled to the first current source for being controlled by the clock signal;
a discharge switch coupled to the second current source for being controlled by the inverse signal of the clock signal; and
a capacitor for being charged by the charge circuit via the charge switch and for being discharged by the discharge circuit via the discharge switch, to generate the ramp signal.

12. The power supply of claim 10, wherein the threshold voltage corresponds to an upper threshold voltage or a lower threshold voltage of the ramp signal.

13. The power supply of claim 10, wherein the comparing unit further comprises:
a second offset cyclic adjusting unit coupled to the second input end and the comparator for providing the offset in a saw-tooth waveform and adding the offset on the ramp signal to generate an offset ramp signal, such that the comparator compares the offset ramp signal with the threshold voltage to generate the jitter clock signal.

14. The power supply of claim 13, wherein the second offset cyclic adjusting unit comprises:
a plurality of branches, each branch including a switch and a transistor, the gate of each transistor coupled with each other, for receiving the ramp signal, wherein the plurality of switches conducts or cuts off the plurality of branches to generate the offset ramp signal.

15. The power supply of claim 13, wherein the second offset cyclic adjusting unit is a transistor having a gate for receiving a saw-tooth wave signal used as the offset.

16. The power supply of claim 10, wherein the first offset cyclic adjusting unit coupled to the first input end and the comparator for providing the offset in a saw-tooth wave form and adding the offset on the threshold voltage to generate an offset threshold voltage such that the comparator compares the ramp signal with the offset threshold voltage to generate the jitter clock signal.

17. The power supply of claim 16, wherein the first offset cyclic adjusting unit comprises:
a plurality of branches, each branch including a switch and a transistor, the gate of each transistor coupled with each other, for receiving the threshold voltage, wherein the plurality of switches conducts or cuts off the plurality of branches to generate the offset threshold voltage signal.

18. The power supply of claim 16, wherein the first offset cyclic adjusting unit is a transistor having a gate for receiving a saw-tooth wave signal used as the offset.

* * * * *